(12) United States Patent
Kim et al.

(10) Patent No.: US 8,139,437 B2
(45) Date of Patent: Mar. 20, 2012

(54) WORDLINE DRIVING CIRCUIT OF SEMICONDUCTOR MEMORY DEVICE

(75) Inventors: Jae-Il Kim, Kyoungki-do (KR);
Chang-Ho Do, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 13/165,697

(22) Filed: Jun. 21, 2011

(65) Prior Publication Data

US 2011/0249517 A1 Oct. 13, 2011

Related U.S. Application Data

(62) Division of application No. 12/157,236, filed on Jun. 9, 2008, now Pat. No. 7,983,097.

(30) Foreign Application Priority Data

Nov. 2, 2007 (KR) .............................. 2007-0111569

(51) Int. Cl.
*G11C 8/00* (2006.01)

(52) U.S. Cl. .......... 365/230.06; 365/230.08; 365/189.09
(58) Field of Classification Search ............. 365/230.06, 365/230.08, 189.09
See application file for complete search history.

(56) References Cited

U.S. PATENT DOCUMENTS 7,221,616 B2 * 5/2007 Jeon ......................... 365/230.06
2006/0104146 A1 5/2006 Lee

FOREIGN PATENT DOCUMENTS

KR 10-2003-0002731 A 1/2003
KR 10-2006-0054573 5/2006

* cited by examiner

*Primary Examiner* — Huan Hoang
(74) *Attorney, Agent, or Firm* — Blakely, Sokoloff, Taylor & Zafman

(57) ABSTRACT

Wordline driving circuit of semiconductor memory device includes a bias generator configured to generate a threshold bias voltage for accessing data, an over-driver configured to increase the threshold bias voltage at an initial stage of a data accessing operation and a wordline driver configured to activate a wordline in response to the threshold bias voltage and a signal output from the over-driver.

7 Claims, 9 Drawing Sheets

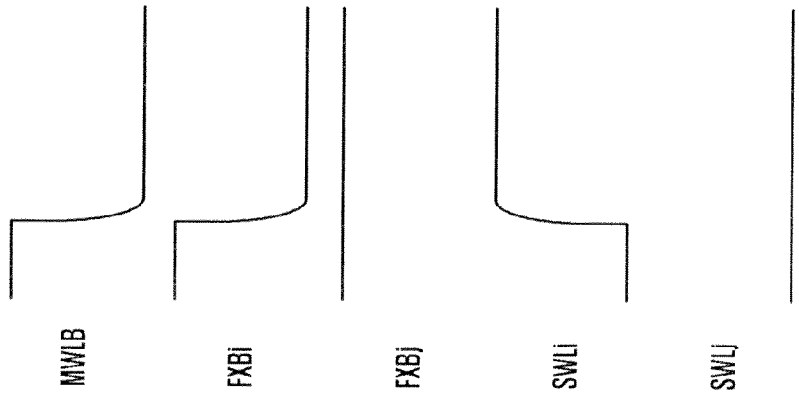
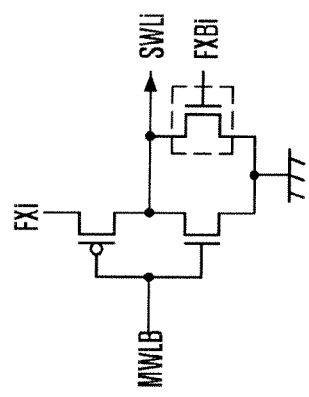

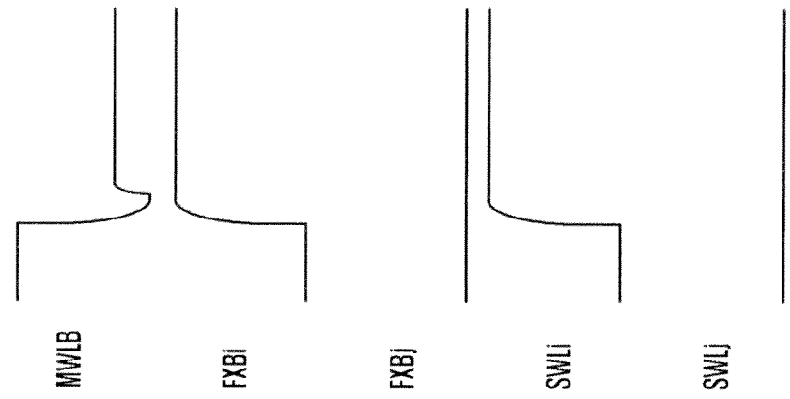
FIG. 2B
(Prior Art)
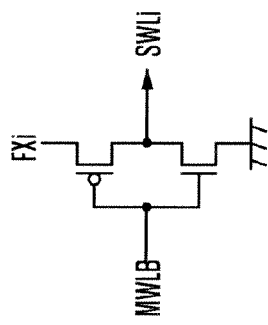
FIG. 2A
(Prior Art)
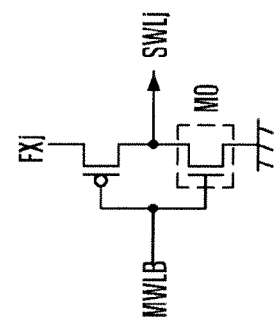

WORDLINE DRIVING CIRCUIT OF SEMICONDUCTOR MEMORY DEVICE

CROSS-REFERENCE TO RELATED APPLICATION

The present patent application is a Divisional application claiming the benefit of application Ser. No. 12/157,236, filed Jun. 9, 2008 now U.S. Pat. No. 7,983,097.

CROSS-REFERENCE TO RELATED APPLICATIONS

The present invention claims priority of Korean patent application number 10-2007-0111569, filed on Nov. 2, 2007, which is incorporated by reference in its entirety.

BACKGROUND OF THE INVENTION

The present invention relates to semiconductor design technology, and more particularly, to a semiconductor memory device including a compact and stable wordline driving device.

Semiconductor memory devices, such as a dynamic random access memory (DRAM), need to store a large amount of data and operate at a high speed using a low input voltage.

Highly integrated semiconductor memory devices have small memory cells and read/write components. For this, lines and transistors of the highly integrated semiconductor memory devices are integrated so as to remove unnecessary parts and reduce the size of the highly integrated semiconductor memory devices.

Each cell of a semiconductor memory device includes a capacitor for storing data and a transistor for controlling read and write operations of the capacitor. The cells are connected to control wordlines and data transfer bit lines. Specifically, a gate of the transistor is connected to the wordline, and one of a drain and a source of the transistor is connected to the bit line. In a cell of a highly integrated semiconductor memory device, a gate of a transistor and a wordline are integrated such that a portion of the wordline is used as the gate of the transistor. However, due to the integration of the gate and the wordline, the capacitance of the wordline increases, and the gate of the transistor needs to be formed of polysilicon having a relatively high resistance. Therefore, it takes much more time to activate or deactivate the wordline. That is, time delay occurs when the wordline is activated using a wordline driving signal produced according to decoded address information. Therefore, data access time increases, and the operating speed of the highly integrated semiconductor memory device decreases.

To address these problems, a semiconductor memory device having a hierarchical wordline structure has been introduced. In a hierarchical wordline structure, a plurality of sub wordlines are connected to a main wordline, and the sub wordlines are driven through the main wordline. Only the sub wordlines are formed of polysilicon and signal transfer lines for selecting the main wordline and the sub wordlines are formed of a metal such as aluminum (Al) so as to minimize signal delay. Sub wordline driving circuits for driving a plurality of sub wordlines through a main wordline will now be described.

FIG. 1A is a circuit diagram illustrating sub wordline driving circuits each including three transistors, and FIG. 1B is a waveform diagram for explaining how the sub wordline driving circuits of FIG. 1A operate.

Referring to FIG. 1A, a semiconductor memory device includes a first sub wordline driving circuit and a second sub wordline driving circuit. The first sub wordline driving circuit drives a first sub wordline SWLi in response to a signal received through a main wordline MWLB. The second wordline driving circuit drives a second sub wordline SWLj in response to a signal received through the main wordline MWLB. The first sub wordline driving circuit includes three transistors, and the second sub wordline driving circuit includes three transistors.

Generally, the main wordline MWLB may be connected to eight sub wordline driving circuits, and each of the eight sub wordline driving circuits receives a wordline driving voltage FX to be applied to a sub wordline SWL, and a wordline discharge signal FXB for controlling the sub wordline SWL. Each of the eight sub wordline driving circuits includes a p-channel metal oxide semiconductor (PMOS) transistor, a first n-channel metal oxide semiconductor (NMOS) transistor, and a second NMOS transistor. The PMOS transistor applies the wordline driving voltage FX to the sub wordline SWL in response to a signal transmitted through the main wordline MWLB. The first NMOS transistor applies a ground voltage to the sub wordline SWL in response to a signal transmitted through the main wordline MWLB. The second NMOS transistor discharges the sub wordline SWL to a ground voltage level in response to the wordline discharge signal FXB.

Referring to FIG. 1B, when the main wordline MWLB is activated to a low logic level and a first wordline driving voltage FXi to the first sub wordline driving circuit is activated, a first wordline discharge signal FXBi is deactivated to a low logic level such that the first sub wordline SWLi can be activated by the first wordline driving voltage FXi. On the other hand, when a second wordline driving voltage FXj to the second sub wordline driving circuit is deactivated, a second wordline discharge signal FXBj is activated to a high logic level such that the second sub wordline SWLj is deactivated to a low logic level.

In detail, there are eight wordline driving voltages FX0 to FX7 corresponding to the main wordline MWLB. Each of the wordline driving voltages FX0 to FX7 has a level corresponding to an input address. When the wordline driving voltage FX is not activated although the main wordline MWLB is activated to a low logic level, the sub wordline SWL can be connected to the ground through the second NMOS transistor in response to the wordline discharge signal FXB so as to prevent the sub wordline SWL from being floated.

The semiconductor memory device includes eight sub wordline driving circuits for each main wordline MWLB. Furthermore, two additional lines as well as the main wordline MWLB are connected to each of the eight sub word line driving circuits to apply the wordline driving voltage FX and the wordline discharge signal FXB to the sub word line driving circuit. Therefore, the size of the semiconductor memory device increases and it is difficult to highly integrate the semiconductor memory device due to a number of lines connected to the sub wordline driving circuits.

To address these problems, an improved sub wordline driving circuit has been introduced. FIG. 2A is a circuit diagram illustrating sub wordline driving circuits each including two transistors, and FIG. 2B is a waveform diagram for explaining how the sub wordline driving circuits of FIG. 2A operate.

Referring to FIGS. 2A and 2B, each of the sub wordline driving circuits includes two transistors. That is, each of the sub wordline driving circuits includes a PMOS transistor and an NMOS transistor. The PMOS transistor applies a wordline driving voltage FX to a sub wordline SWL in response to a signal transmitted through a main wordline MWLB. The NMOS transistor adjusts the voltage level of the sub wordline SWL to a ground voltage in response to a signal received through the main wordline MWLB.

When the main wordline MWLB is activated to a low logic level and an activated first wordline driving voltage FXi is applied to a first sub wordline SWLi, the sub wordline driving circuit operates in the same way as the sub wordline driving circuits depicted in FIG. 1A. When a second wordline driving voltage FXj is not activated although the main wordline MWLB is activated to a low logic level, the main wordline MWLB has the same voltage level as the threshold voltage level of the NMOS transistor instead of a ground voltage level so as to prevent the sub wordlines SWL from being floated. That is, the sub wordlines SWL are connected to the ground through the NMOS transistors, thereby preventing the sub wordlines SWL from being in a floating state. Therefore, since each of the sub wordline driving circuits includes only two transistors and does not require lines for receiving a wordline discharge signal, the sub wordline driving circuits occupy smaller areas.

However, the NMOS transistor needs to have a threshold voltage different from that of the PMOS transistor. For this, for example, the sub wordline driving circuit should be designed in consideration of the turn-on resistances of the NMOS and PMOS transistors in a manner such that the NMOS transistor and the PMOS transistor have different channel widths and lengths.

FIG. 3 is a circuit diagram illustrating wordline line driving circuits of a typical semiconductor memory device.

Referring to FIG. 3, the semiconductor memory device includes a main wordline driving circuit 320 and sub wordline driving circuits 340_0 to 340_7. The main wordline driving circuit 320 activates a main wordline in response to first to third control signals DR1 to DR3 produced according to address information decoded using a decoder. The sub wordline driving circuits 340_0 to 340_7 activate sub wordlines SWL0 to SWL7 in response to a signal transmitted through the main wordline and wordline driving voltages FX0 to FX7.

The main wordline driving circuit 320 includes a first PMOS transistor, a first NMOS transistor, a second NMOS transistor, and a second PMOS transistor. The first PMOS transistor applies a high voltage VPP to the main wordline in response to the first control signal DR1 so as to deactivate the main wordline. The first NMOS transistor activates the main wordline to a ground voltage level in response to the second control signal DR2. The second NMOS transistor maintains the main wordline at the same voltage level as the threshold voltage level of NMOS transistors of the sub wordline driving circuits 340_0 to 340_7 in response to the third control signal DR3. Here, the voltage level of the main wordline is determined between a core voltage level VCORE and a ground voltage level by a ratio of the resistances of the second PMOS transistor and the second NMOS transistor.

The sub wordline driving circuits 340_0 to 340_7 have the same structure as the two-transistor sub wordline driving circuit shown in FIG. 2A. Thus, detailed descriptions of the sub wordline driving circuits 340_0 to 340_7 will be omitted.

FIGS. 4A and 4B are waveform diagrams for explaining how the wordline driving circuits of FIG. 3 operate. Referring to FIG. 4A, the main wordline MWLB is activated to a low logic level in response to control signals DR1 to DR3, and an activated wordline driving voltage FX is applied to the sub wordline driving circuits 340_0 to 340_7 to activate the sub wordlines SWL. Referring to FIG. 4B, the wordline driving voltage FX is not activated although the main wordline MWLB is activated to a low logic level in response to control signals DR1 to DR3 such that the sub wordline driving circuits 340_0 to 340_7 deactivate the sub wordlines SWL.

Referring again to FIG. 4B, the activated main wordline MWLB is maintained at a predetermined voltage level instead of maintaining the main wordline MWLB at a ground voltage level so as to prevent the sub wordlines SWL from being floated. For this, as described above, the turn-on resistance of the second NMOS transistor included in the main wordline driving circuit 320 is adjusted using the third control signal DR3 so as to maintain the ratio of the resistances of the second PMOS transistor and the second NMOS transistor. However, in this case, since the voltage level of the activated main wordline MWLB is sensitive to the third control signal DR3, the semiconductor memory device may operate unstably. Furthermore, since the activated main wordline MWLB is maintained at a predetermined voltage level, a current path can be formed between the PMOS transistor and the NMOS transistor of the main wordline driving circuit 320, and thus the voltage levels of the sub wordlines SWL0 to SWL7 can be unstable.

SUMMARY OF THE INVENTION

Embodiments of the present invention are directed to providing a wordline driving circuit of a semiconductor memory device having a hierarchical wordline structure. The wordline driving circuit occupies a small area and allows the semiconductor memory device to operate stably with no floated wordline.

In accordance with an aspect of the present invention, there is provided a bias generator configured to generate a threshold bias voltage for accessing data, an over-driver configured to increase the threshold bias voltage at an initial stage of a data accessing operation and a wordline driver configured to activate a wordline in response to the threshold bias voltage and a signal output from the over-driver. In accordance with another aspect of the present invention, there is provided a main wordline driving unit configured to activate a main wordline according to decoded address information and a sub wordline driving unit configured to supply a wordline driving voltage to a sub wordline corresponding to the main wordline, the sub wordline being connected to a plurality of cells, wherein after the main wordline activated, a voltage level of the main wordline is increased to a level of a threshold voltage of a MOS transistor using a power-supply voltage so as to prevent the sub wordline from being floated. In accordance with another aspect of the present invention, there is provided a main wordlines, a sub wordlines connected to the main wordlines, a wordline control circuit configured to maintain an activated main wordline at a level of a threshold voltage of a MOS transistor so as to prevent the sub wordlines from being floated and a plurality of bias generators, each provided for each one or two of the banks and configured to generate the threshold voltage of the MOS transistor in response to an active command. In accordance with another aspect of the present invention, there is provided a method for operating a semiconductor memory device, the method includes a step of generating a threshold voltage of a MOS transistor in response to an active command, a step of activating a main wordline according to decoded address information and a step of supplying a wordline driving voltage to a sub wordline corresponding to the main wordline and connected to a plurality of cells, wherein a voltage level of the main wordline is increased to a level of the threshold voltage of the MOS transistor using a power-supply voltage for a predetermined time after the main wordline is activated, so as to prevent the sub wordline from being floated.

BRIEF DESCRIPTION OF THE DRAWINGS

FIG. 1A is a circuit diagram illustrating wordline driving circuits each including three transistors.

FIG. 1B is a waveform diagram for explaining how the wordline driving circuits of FIG. 1A operate.

FIG. 2A is a circuit diagram illustrating wordline driving circuits each including two transistors.

FIG. 2B is a waveform diagram for explaining how the wordline driving circuits of FIG. 2A operate.

DESCRIPTION OF SPECIFIC EMBODIMENTS

Hereinafter, a wordline driving circuit of a semiconductor memory device in accordance with the present invention will be described in detail with reference to the accompanying drawings.

Figure 3:
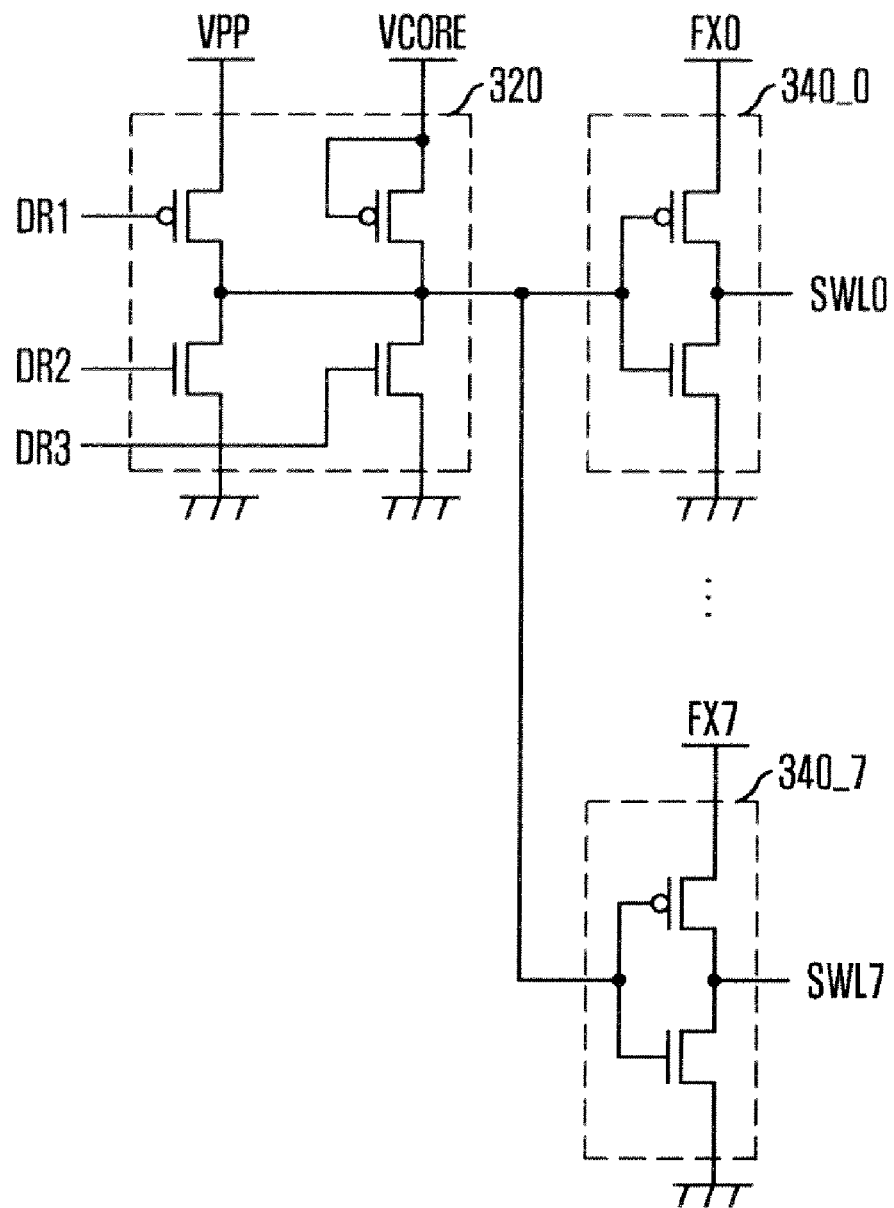
FIG. 3 is a circuit diagram illustrating wordline line driving circuits of a typical semiconductor memory device.
Figure 4A:
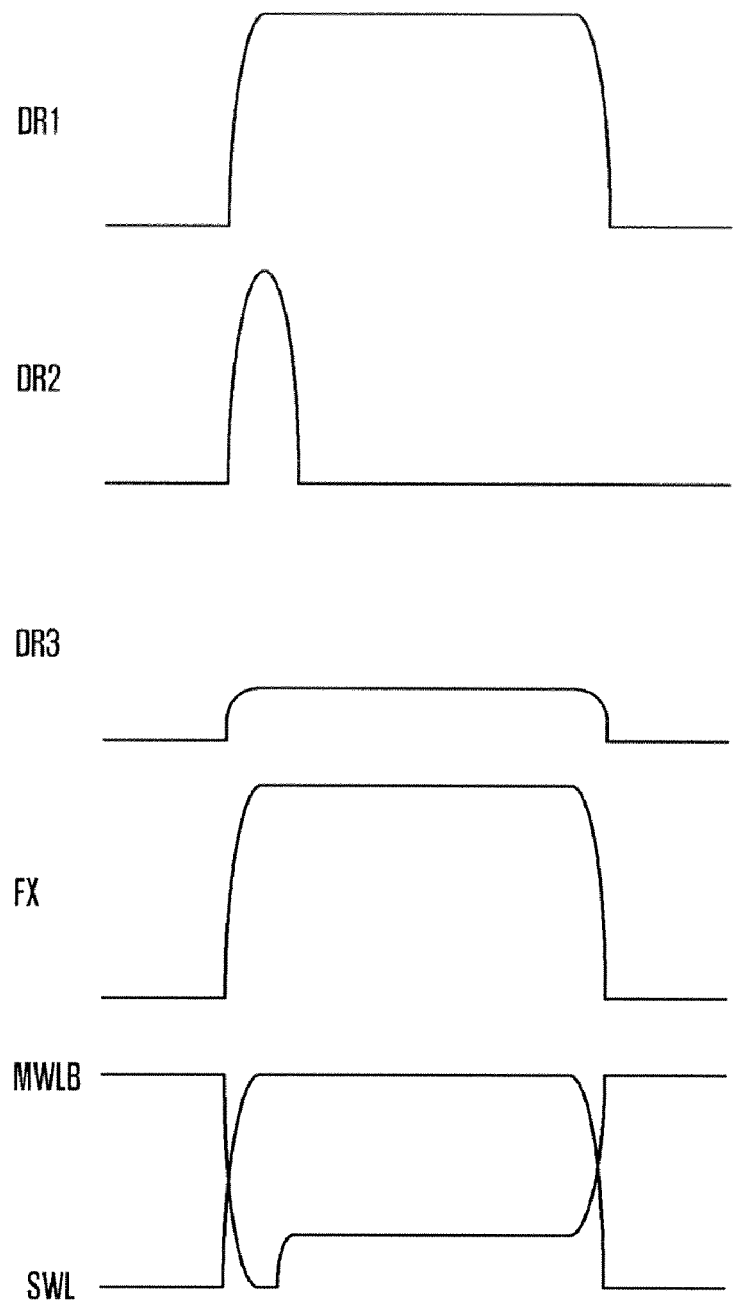
FIGS. 4A and 4B are waveform diagrams for explaining how the wordline driving circuits of FIG. 3 operate.
Figure 4B:
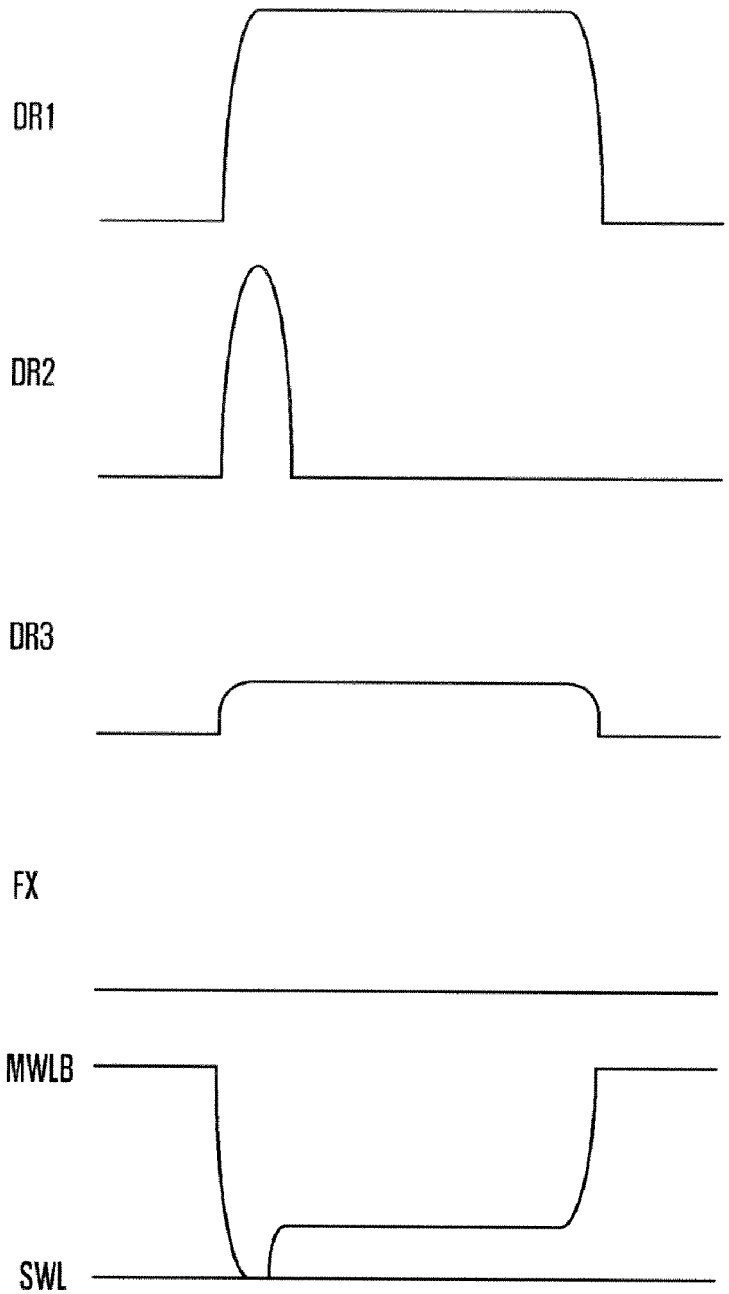
Figure 5:
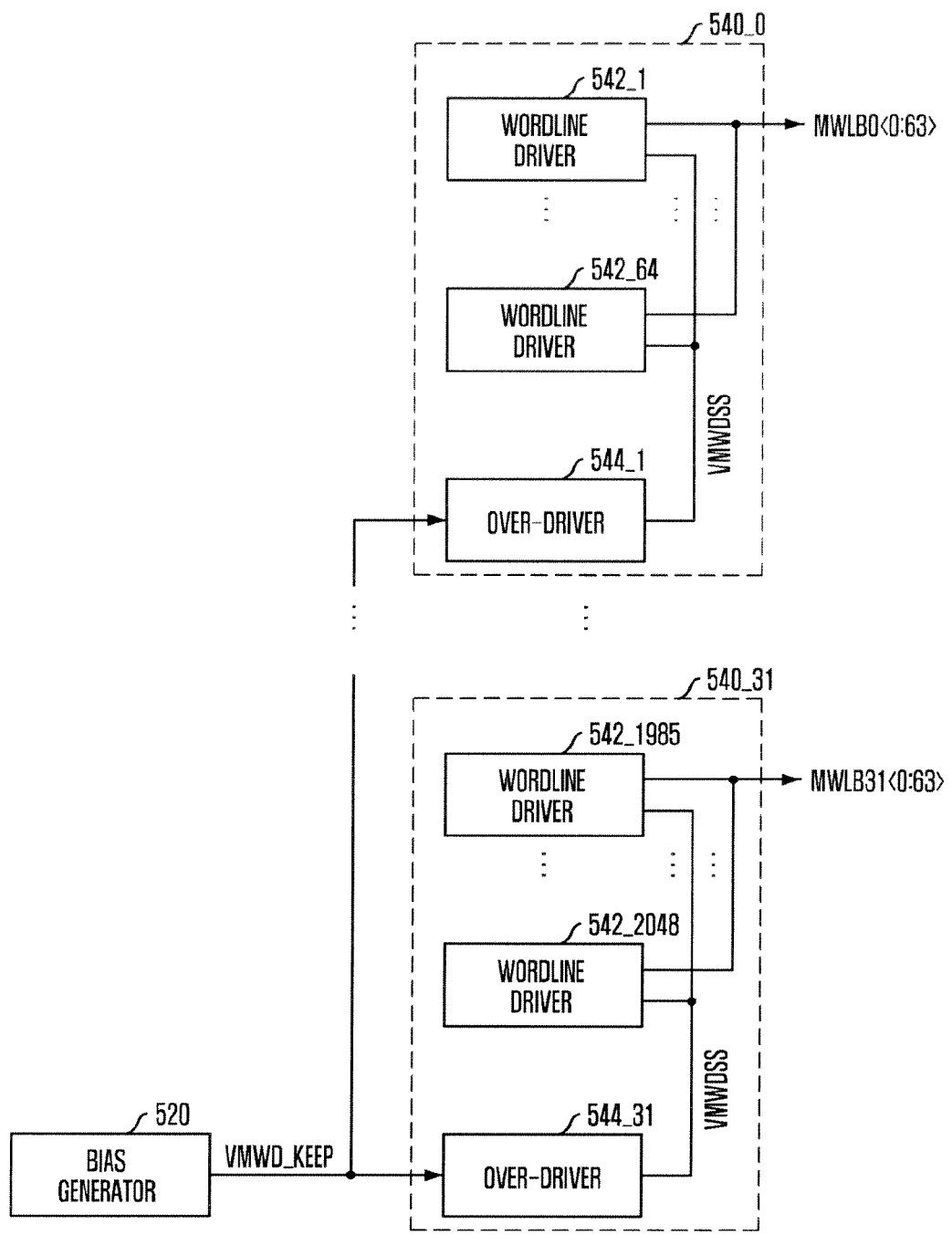
FIG. 5 is a circuit diagram illustrating wordline driving units of a semiconductor memory device in accordance with an embodiment of the present invention.

FIG. 5 is a circuit diagram illustrating a wordline driving circuit of a semiconductor memory device in accordance with an embodiment of the present invention.

Referring to FIG. 5, the semiconductor memory device includes main wordline driving units 540_0 to 540_31 and sub wordline driving units (not shown). The main wordline driving units 540_0 to 540_31 activate main wordlines MWLB0<0:63> to MWLB31<0:63> according to decoded address information. The sub wordline driving units apply a wordline driving voltage FX to sub wordlines (not shown) connected to a plurality of cells in response to signals transmitted through the main wordlines MWLB0<0:63> to MWLB31<0:63>. The semiconductor memory device further includes a bias generator 520. The bias generator 520 generates a threshold voltage VMWD_KEEP of a metal oxide semiconductor (MOS) transistor to supply the threshold voltage VMWD_KEEP to the main wordlines MWLB0<0:63> to MWLB31<0:63> that are activated in response to active commands for accessing data.

In accordance with the current embodiment, the semiconductor memory device includes a plurality of cells and a hierarchical wordline structure for controlling the cells. Each of the sub wordline driving units includes a plurality of driving circuits (not shown) for driving eight sub wordlines connected to one main wordline. Each of the driving circuits includes a PMOS transistor and an NMOS transistor like the driving circuit shown in FIG. 2A. That is, when the main wordlines MWLB0<0:63> to MWLB31<0:63> and the wordline driving voltage FX are activated, the driving circuits of the sub wordline driving units transmit the wordline driving voltage FX to the sub wordlines so as to access cells of the semiconductor memory device. However, when the wordline driving voltage FX is not activated although the main wordlines MWLB0<0:63> to MWLB31<0:63> are activated, the driving units apply a ground voltage to the sub wordlines using voltage levels of the main wordlines MWLB0<0:63> to MWLB31<0:63>.

When an activated wordline driving voltage FX is not applied to some of the sub wordlines although the main wordlines MWLB0<0:63> to MWLB31<0:63> are activated to a low logic level, wordline control circuits of the semiconductor memory device are maintained at a threshold voltage level of a MOS transistor (not a ground voltage level) so as to prevent some of the sub wordlines from being floated. The wordline control circuits are included in banks of the semiconductor memory device, respectively. The bias generator 520 may be provided for each one or two of the banks for generating a threshold voltage VMWD_KEEP of a MOS transistor and applying the threshold voltage VMWD_KEEP to the wordline control circuits.

The main wordline driving units 540_0 to 540_31 are included in the wordline control circuit, and each of the main wordline driving units 540_0 to 540_31 includes an over-driver 544 and a plurality of wordline drivers 542. For example, referring to the first main wordline driving unit 540_0, the over-drivers 544_1 supply a power supply voltage to the wordline drivers 542_1 to 542_64 for a predetermined time after the main wordline MWLB0<0:63> is activated. Then, the over-driver 544_1 transmits a threshold voltage VMWD_KEEP produced by the bias generator 520 to the wordline drivers 542_1 to 542_64. The wordline drivers 542_1 to 542_64 activate the main wordline MWLB0<0:63> according to a decoded address and maintain the voltage level of the main wordline MWLB0<0:63> using a bias voltage VMWDSS during an activation period.

The ratio of the number of the main wordlines MWLB0<0:63> to MWLB31<0:63> and the number of the sub wordlines can be varied according to, for example, the data-storage capacity or operating characteristics of the semiconductor memory device.

Figure 6A:
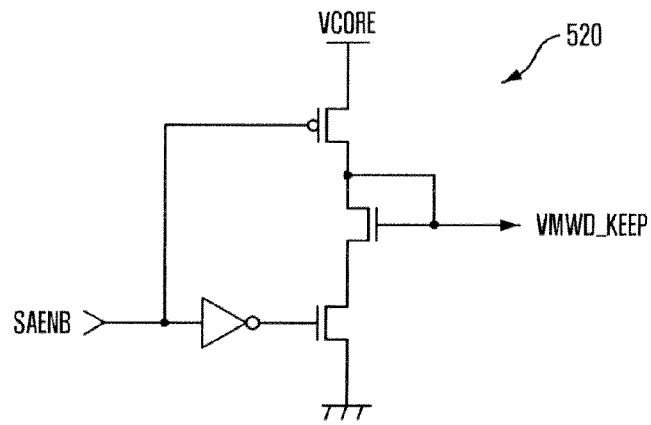
FIG. 6A is a circuit diagram illustrating a bias generator of the semiconductor memory device of FIG. 5 in accordance with an embodiment of the present invention.

FIG. 6A is a circuit diagram illustrating the bias generator 520 of FIG. 5 in accordance with an embodiment of the present invention.

Referring to FIG. 6A, the bias generator 520 includes a p-channel metal oxide semiconductor (PMOS) transistor, a first n-channel metal oxide semiconductor (NMOS) transistor, and a second NMOS transistor. The PMOS transistor transfers a core voltage VCORE in response to a sense amp enable signal SAENB. The first NMOS transistor transfers a ground voltage in response to the sense amp enable signal SAENB. The second NMOS transistor is disposed between the PMOS transistor and the first NMOS transistor thereby outputting a threshold voltage VMWD_KEEP through its gate that connected to its drain.

When the semiconductor memory device receives an address corresponding to a read or write command, the semiconductor memory device decodes the address using a decoder and operates a sense amp connected to a corresponding cell through a bit line. For example, the semiconductor memory device activates a wordline to access a cell corresponding to a read command and transmit data from the cell through a bit line. Then, the semiconductor memory device operates a sense amp to sense and amplify the data transmitted through the bit line. The bias generator 520 generates a bias voltage when a sub wordline connected to a cell is activated. In detail, when a sense amp enable signal SAENB for operating the sense amp is activated to a low logic level and is applied to the bias generator 520, the bias generator 520 generates a threshold voltage VMWD_KEEP of a MOS transistor.

In more detail, after the PMOS transistor and the first NMOS transistor are turned on in response to a sense amp enable signal SAENB, a current passes through the second NMOS transistor whose gate and drain are connected to each other. When the first NMOS transistor is turned on, a ground voltage is applied to a source of the second NMOS transistor, and a threshold voltage is maintained between the source and gate of the second NMOS transistor. Therefore, when the sense amp enable signal SAENB is activated, the bias generator 520 can stably output a threshold voltage VMWD_KEEP. The first NMOS transistor and the second NMOS transistor may have low threshold voltages.

Figure 6B:
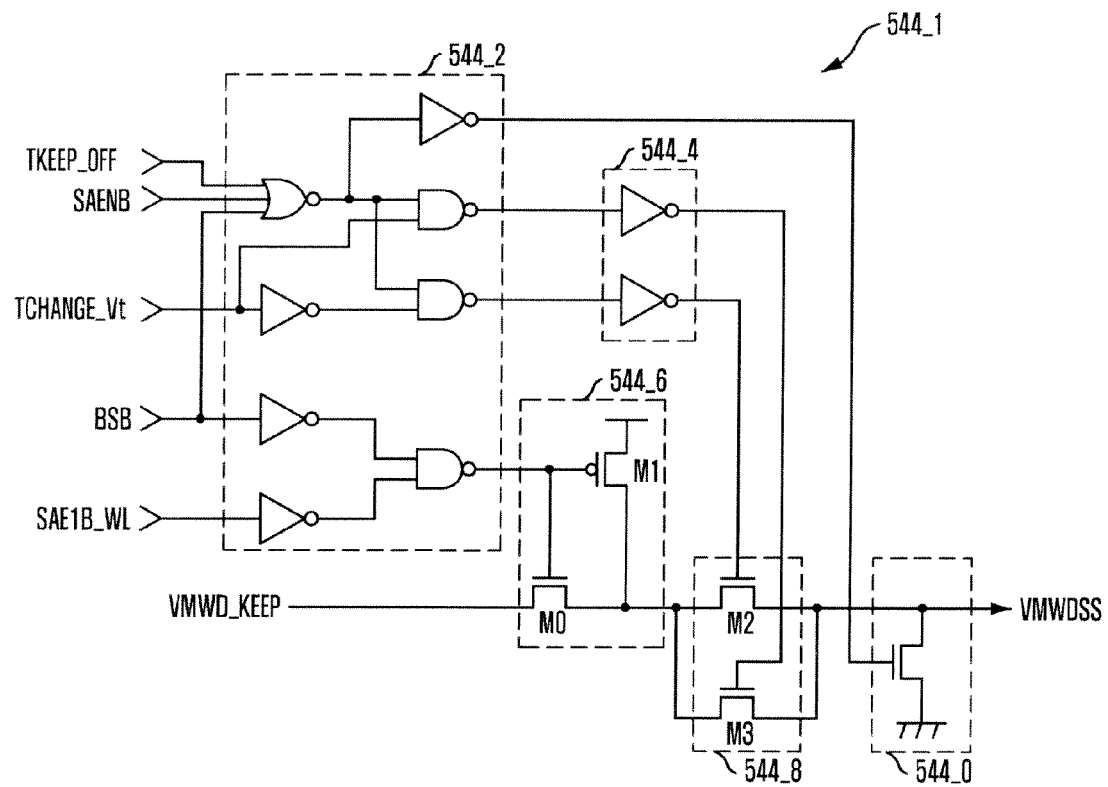
FIG. 6B is a circuit diagram illustrating a first over-driver depicted in FIG. 5 in accordance with an embodiment of the present invention.

FIG. 6B is a circuit diagram illustrating the first over-driver 544_1 depicted in FIG. 5 in accordance with an embodiment of the present invention.

Referring to FIG. 6B, the first over-driver 544_1 includes a first driver 544_6, a transmitter 544_8, a transfer controller 544_4, a second driver 544_0, and a controller 544_2. In an initial stage of a data accessing operation, the first driver 544_6 transmits a power-supply voltage instead of transmitting a threshold voltage VMWD_KEEP generated by the bias generator 520. The transmitter 544_8 transmits a difference between a core voltage VCORE and the threshold voltage VMWD_KEEP to the wordline drivers 542_1 to 542_64 in response to a signal output from the first driver 544_6. The transfer controller 544_4 transmits the core voltage VCORE to the transmitter 544_8. The second driver 544_0 outputs a ground voltage when the data accessing operation is completed. The controller 544_2 controls operation times of the first driver 544_6, the transmitter 544_8, the transfer controller 544_4, and the second driver 544_0 during the data accessing operation.

The controller 544_2 controls the first driver 544_6 in response to a cell matrix select signal BSB activated by an active command and a first control pulse SAE1B_WL generated to activate the first driver 544_6 in an initial operation. The cell matrix select signal BSB is a signal output from a decoder in response to an active command and an input address so as to select a region including a cell to be accessed. When activated, the cell matrix select signal BSB has a low logic level. The first control pulse SAE1B_WL is temporarily activated to a low logic level and then deactivated to a high logic level when a main wordline is activated for driving the main wordline using a power-supply voltage level.

The first driver 544_6 includes a first MOS transistor M0 and a second MOS transistor M1. The second MOS transistor M1 transfers a power-supply voltage in response to a signal output from the controller 544_2. The first MOS transistor M0 transfers a threshold voltage VMWD_KEEP output from the bias generator 520. When the cell matrix select signal BSB and the first control pulse SAE1B_WL are activated to a low logic level, the first MOS transistor M0 is turned off, and the second MOS transistor M1 is turned on such that a power-supply voltage can be applied to the transmitter 544_8. When the first control pulse SAE1B_WL is deactivated to a logic high level, the second MOS transistor M1 is turned off and the first MOS transistor M0 is turned on such that the threshold voltage VMWD_KEEP can be applied to the transmitter 544_8. The first MOS transistor M0 may have a low threshold voltage so as to transmit the threshold voltage VMWD_KEEP with no loss when the first MOS transistor M0 is turned on.

In addition, the controller 544_2 controls the transmitter 544_8 and the transfer controller 544_4 in response to a cell matrix select signal BSB, a sense amp enable signal SAENB, a threshold voltage change pulse TCHANGE_Vt, and a voltage keeping end pulse TKEEP_OFF. The threshold voltage change pulse TCHANGE_Vt is a control signal for maintaining the level of a threshold voltage VMWD_KEEP after a main wordline is activated. The threshold voltage change pulse TCHANGE_Vt may be used in the same way as the first control pulse SAE1B_WL or may be generated by delaying the first control pulse SAE1B_WL. The voltage keeping end pulse TKEEP_OFF is a control signal for outputting a ground voltage to the wordline drivers 542_1 to 542_64 as a bias voltage VMWDSS when the main wordline is deactivated.

The cell matrix select signal BSB, the sense amp enable signal SAENB, and the voltage keeping end pulse TKEEP_OFF have a low logic level when they are activated. If at least one of the cell matrix select signal BSB, the sense amp enable signal SAENB, and the voltage keeping end pulse TKEEP_OFF is deactivated, the main wordline is not activated. In this case, the controller 544_2 turns on a fifth MOS transistor of the second driver 544_0 so as to output a ground voltage through the second driver 544_0 as a bias voltage VMWDSS.

When the cell matrix select signal BSB, the sense amp enable signal SAENB, and the voltage keeping end pulse TKEEP_OFF are activated to a low logic level, the controller 544_2 controls the transmitter 544_8 according to the threshold voltage change pulse TCHANGE_Vt. The transmitter 544_8 includes a third MOS transistor M2 and a fourth MOS transistor M3. The third MOS transistor M2 has a low threshold voltage for transferring a threshold voltage VMWD_KEEP received from the first driver 544_6. The fourth MOS transistor M3 transfers a power-supply voltage received from the first driver 544_6. Referring again to FIG. 6B, when the threshold voltage change pulse TCHANGE_Vt has a low logic level, the third MOS transistor M2 of the transmitter 544_8 is turned on to transmit a threshold voltage VMWD_KEEP. When the threshold voltage change pulse TCHANGE_Vt has a high logic level, the fourth MOS transistor M3 of the transmitter 544_8 is turned on. Here, the third MOS transistor M2 and the fourth MOS transistor M3 of the transmitter 544_8 are turned on by using signals having a voltage level of the core voltage VCORE and transferred to the transmitter 544_8 through the transfer controller 544_4.

The transfer controller 544_4 includes inverters for inverting signals transferred from the controller 544_2. Since the controller 544_2 operates using a power-supply voltage, signals output from the controller 544_2 have a voltage level between the power-supply voltage VDD and a ground voltage. However, since the inverters of the transfer controller 544_4 invert signals using the core voltage VCORE, signals output from the transfer controller 544_4 have a voltage level between the core voltage VCORE and the ground voltage. Therefore, a power-supply voltage output from the first driver 544_6 can be output as a bias voltage VMWDSS after the voltage level of the power-supply voltage is reduced by a threshold voltage level by the fourth MOS transistor M3 of the transmitter 544_8.

As described above, in the semiconductor memory device, when the main wordline is activated to a low logic level, floating of the sub wordlines are prevented by temporarily supplying a power-supply voltage to the sub wordlines to increase the voltage level of the sub wordlines to the level of a threshold voltage VMWD_KEEP. Here, if the power-supply voltage is excessively high, the logic level of the main wordline can be changed, or the PMOS transistor and the NMOS transistor of the sub wordline driving unit can be simultaneously turned on to form a current path. For this reason, the transfer controller 544_4 is used to reduce the level of the power-supply voltage by a threshold voltage. Therefore, the semiconductor memory device can operate stably.

Figure 6C:
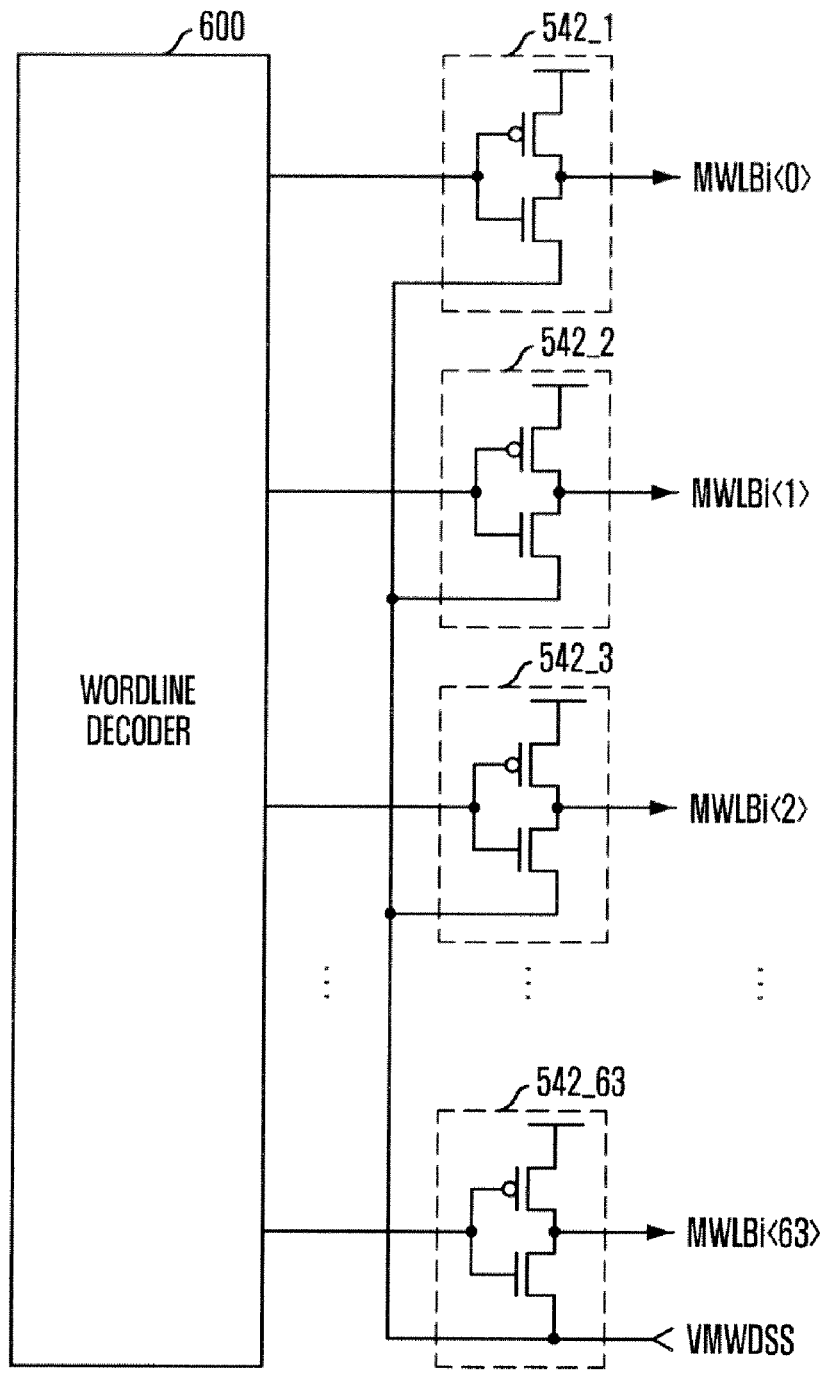
FIG. 6C is a block diagram illustrating wordline drivers of FIG. 5 in accordance with an embodiment of the present invention.

FIG. 6C is a block diagram illustrating the wordline drivers 542_1 to 542_64 of FIG. 5 in accordance with an embodiment of the present invention.

Referring to FIG. 6C, the wordline drivers 542_1 to 542_64 are used to activate main wordlines MWLBi<0:63> to a low logic level and deactivate the main wordlines MWLBi<0:63> to a high logic level in response to decoding results output from a wordline decoder 600 of the semiconductor memory device. The wordline decoder 600 receives a command and an address and decodes the command and address for activating a main wordline and accessing a cell corresponding to the command and address. Since the wordline decoder 600 may have a structure well known to those of skill in the art, a detailed description thereof will be omitted.

In detail, each of the wordline drivers 542_1 to 542_64 includes a PMOS transistor and an NMOS transistor. The PMOS transistor deactivates the main wordline MWLBi<0:63> to a high logic level according to decoding results. The NMOS transistor activate the main wordline MWLBi<0:63> to a low logic level using a bias voltage VMWDSS output from the over-driver 544_1 in response to the decoding results.

Figure 7A:
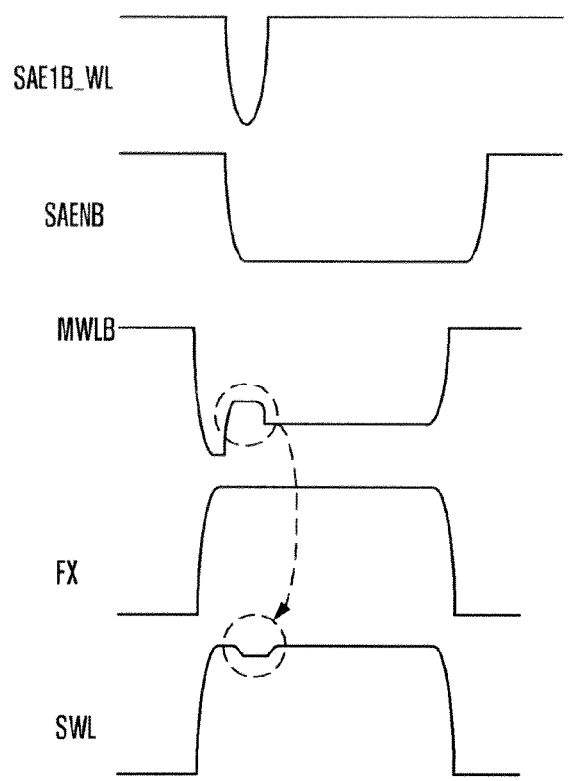
FIGS. 7A and 7B are waveform diagrams for explaining how the wordline driving units of FIG. 5 operate.
Figure 7B:
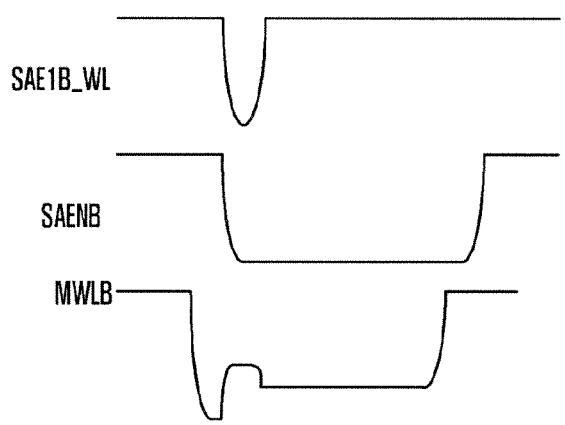

FIGS. 7A and 7B are waveform diagrams for explaining how the wordline driving units of FIG. 5 operate. Referring to FIG. 7A, a main wordline MWLB is activated to a low logic level in response to a first control pulse SAE1B_WL and a sense amp enable signal SAENB, and a wordline driving voltage FX is activated such that a sub wordline driving unit activates a sub wordline SWL. Referring to FIG. 7B, Although the main wordline MWLB is activated to a low logic level in response to the first control pulse SAE1B_WL and the sense amp enable signal SAENB, the wordline driving voltage FX is not activated such that the sub wordline driving unit deactivates the sub wordline SWL.

As shown in FIG. 7A, immediately after the main wordline MWLB is activated to a low logic level (a ground voltage level), an over-driver generates a bias voltage VMWDSS by subtracting a threshold voltage from a power-supply voltage and transfers the bias voltage VMWDSS to a wordline driver in response to the first control pulse SAE1B_WL. Therefore, when the first control pulse SAE1B_WL is activated, the main wordline MWLB can be kept at a voltage level higher than a ground voltage level owing to the bias voltage VMWDSS. Thereafter, after the first control pulse SAE1B_WL is deactivated to a high logic level, the main wordline MWLB is kept at the level of a threshold voltage VMWD_KEEP of a MOS transistor until the main wordline MWLB is deactivated to a high logic level. At this time, when an activated wordline driving voltage FX is applied to the sub wordline SWL, the sub wordline SWL is activated as shown in FIG. 7A.

As shown in FIG. 7B, when the wordline driving voltage FX is deactivated, the main wordline MWLB is kept at the level of the threshold voltage VMWD_KEEP (not at the ground voltage level) so that the sub wordline SWL can be prevented from being floated by reducing the voltage level of the sub wordline SWL to the ground voltage level.

As described above, in the semiconductor memory device having a hierarchical wordline structure in accordance with the present invention, owing to the sub wordline driver including two transistors, a threshold voltage of a MOS transistor can be stably supplied for preventing floating of a sub wordline. Furthermore, the voltage level of the main wordline activated to a low logic level is increased to the threshold voltage level of a MOS transistor by driving the main wordline using a power-supply voltage for a predetermined time immediately after the main wordline is activated so that the operating speed and characteristics of the semiconductor memory device can be improved. In addition, since the semiconductor memory device can operate stably owing to the sub wordline drivers each including two transistors, the integration level of the semiconductor memory device can be largely increased.

In the semiconductor memory device having a hierarchical wordline structure in accordance with the present invention, the wordline control circuit has a small size and can stably supply a predetermined voltage to the main wordline activated to a low logic level so as to prevent the sub wordline corresponding to the main wordline from being floated. Therefore, data accessing operations of the semiconductor memory device can be stably performed.

In addition, the bias generator is additionally provided to maintain the voltage level of the main wordline. For a predetermined time after the main wordline is activated, power supplied to the bias generator for generating a bias voltage is temporarily increased so as to prevent the sub wordline from being floated. Therefore, the semiconductor memory device operates stably at a high speed.

While the present invention has been described with respect to the specific embodiments, it will be apparent to those skilled in the art that various changes and modifications may be made without departing from the spirit and scope of the invention as defined in the following claims.

What is claimed is:

1. A wordline control circuit, comprising:
   a bias generator configured to generate a threshold bias voltage for accessing data;
   an over-driver configured to output a power-supply voltage at an initial stage of a data accessing operation and output the threshold bias voltage after the initial stage of the data accessing operation; and
   a wordline driver configured to activate a wordline in response to the threshold bias voltage and a signal output from the over-driver.

2. The wordline control circuit as recited in claim 1, wherein the the threshold bias voltage has the same level as a threshold voltage of an n-channel metal oxide semiconductor (NMOS) transistor in response to a sense amp enable signal generated to activate a bit line sense amp for accessing data.

3. The wordline control circuit as recited in claim 2, wherein during the initial stage of the data accessing operation, the signal output from the over-driver has a voltage level smaller than a voltage level obtained by subtracting a threshold voltage of a MOS transistor from a core voltage supplied to a core region of a semiconductor memory device.

4. The wordline control circuit as recited in claim 3, wherein the wordline is activated to a low logic level and is kept at a level of the threshold voltage of the NMOS transistor after the initial stage of the data accessing operation.

5. The wordline control circuit as recited in claim 4, wherein the bias generator comprises:
   a p-channel metal oxide semiconductor (PMOS) transistor configured to transfer the core voltage in response to the sense amp enable signal;
   a first NMOS transistor configured to transfer a ground voltage in response to the sense amp enable signal; and
   a second NMOS transistor disposed between the PMOS transistor and the first NMOS transistor outputting the threshold bias voltage through a gate of the second NMOS transistor, wherein the gate of the second NMOS transistor is connected its drain.

6. The wordline control circuit as recited in claim 3, wherein the over-driver comprises:
- a first driver configured to transfer the power-supply voltage instead of the threshold bias voltage at the initial stage of the data accessing operation;
- a transmitter configured to output a voltage, obtained by subtracting the threshold voltage of the MOS transistor from the core voltage, to the wordline driver in response to a signal output from the first driver;
- a transfer controller configured to transfer the core voltage to the transmitter for accessing data;
- a second driver configured to output a ground voltage after the data accessing operation; and
- a controller configured to determine operating times of the first driver, the transmitter, the transfer controller, and the second driver for accessing data.

7. The wordline control circuit as recited in claim 6, wherein the controller controls the first driver in response to a cell matrix select signal activated by an active command input for accessing data, and a first control pulse generated for activating the first driver at the initial stage of the data accessing operation;
- the controller controls the transmitter and the transfer controller in response to the cell matrix select signal, the sense amp enable signal, a threshold voltage change pulse activated after the initial stage, and a voltage keeping end pulse activated after the data accessing operation; and
- the controller controls the second driver in response to the cell matrix select signal, the sense amp enable signal, and the voltage keeping end pulse.

* * * * *